United States Patent [19]

Favata et al.

[11] Patent Number: 4,727,271

[45] Date of Patent: Feb. 23, 1988

[54] APPARATUS FOR INCREASING THE INPUT NOISE MARGIN OF A GATE

[75] Inventors: Alfred F. Favata, Newburgh; Gene J. Gaudenzi, Purdys, both of N.Y.

[73] Assignee: International Business Machines Corporation, Armonk, N.Y.

[21] Appl. No.: 739,170

[22] Filed: May 30, 1985

[51] Int. Cl.[4] .................... H03K 5/00; H03K 19/173
[52] U.S. Cl. .............................. 307/542; 307/546; 307/465
[58] Field of Search ............... 307/542, 546, 200 A, 307/443, 475, 300, 553, 562, 540, 547, 549, 555, 557, 567, 457, 456

[56] References Cited

U.S. PATENT DOCUMENTS

| | | | |
|---|---|---|---|
| 3,436,563 | 4/1969 | Regitz | 307/270 |
| 3,491,251 | 1/1970 | Witsell | 307/443 |
| 3,628,053 | 12/1971 | Weiss | 307/443 |
| 3,766,412 | 10/1973 | Takahashi et al. | 307/265 |
| 3,824,408 | 7/1974 | Brunel | 307/300 |
| 4,006,370 | 2/1977 | Erler | 307/300 |
| 4,132,906 | 1/1979 | Allen | 307/300 |
| 4,590,389 | 5/1986 | Caves et al. | 307/542 |

OTHER PUBLICATIONS

Eardley, "Latch Circuit Insensitive to Disturb By Alpha Particles", *IBM Tech. Disclosure,* vol. 24, No. 12, May 1982, pp. 6461-6462.

Barish et al., "Driver Circuits", *IBM Tech. Disclosure,* vol. 25, No. 9, Feb. 1983, pp. 4860-4862.

Chang et al., "Slow/Fast Time of Flight Driver", *IBM Tech. Disclosure,* vol. 18, No. 11, Apr. 1976, pp. 3635-3636.

Kalter et al., "Field-Effect Transistor Driver Circuit", *IBM Tech. Disclosure,* vol. 18, No. 4, Sep. 1975, pp. 1028-1029.

*Primary Examiner*—Stanley D. Miller
*Assistant Examiner*—Timothy P. Callahan
*Attorney, Agent, or Firm*—Stanger, Michaelson, Reynolds, Spivak and Tobia

[57] ABSTRACT

An apparatus for inclusion into a gate which provides that gate with an increased input noise margin while advantageously eliminating the need to operate that gate at an increased power supply potential.

16 Claims, 1 Drawing Figure

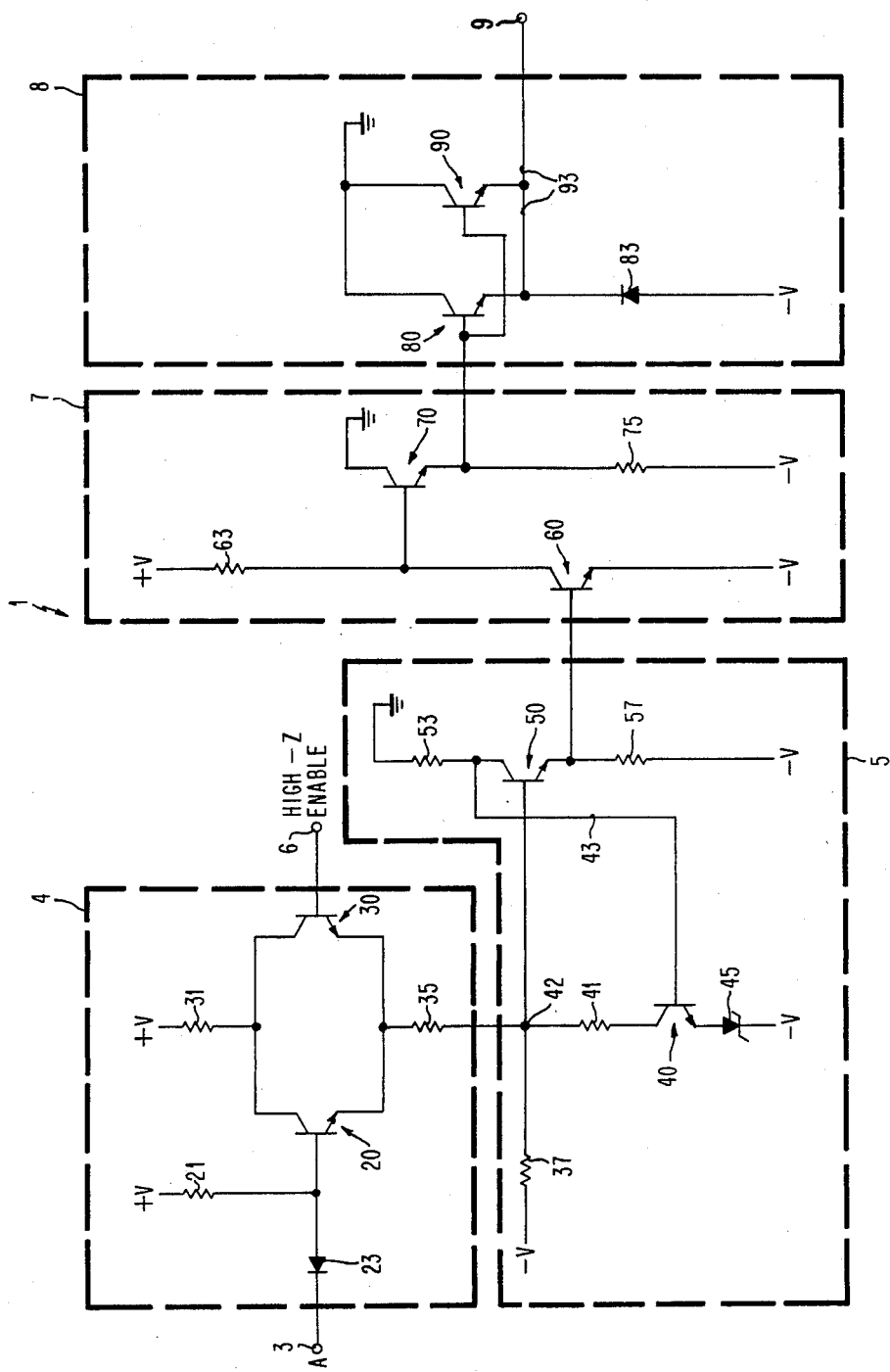

“4,727,271”

APPARATUS FOR INCREASING THE INPUT NOISE MARGIN OF A GATE

BACKGROUND OF THE INVENTION

1. Field of the Invention

The invention relates to apparatus which can increase the input noise margin of a gate.

2. Description of the Prior Art

A digital signal normally possesses two distinct logical values (e.g. "0" and a "1"). However, in practice, a range of analog voltages, rather than one specific voltage, is used to represent each of these logical values. Each range is governed by the particular digital logic technology used. For example, when standard transistor-transistor logic (TTL) is used, a range of relatively low level positive d.c. voltages, running from, for example, ground or zero volts to approximately +0.8 volts, often represents a "0". A range of higher voltages, generally running from +2.4 to a +5 volt power supply potential, is used to represent a "1". The smallest difference between these ranges, i.e. the largest voltage associated with a "0" and the lowest voltage associated with a "1", is called the noise margin. Hence, for standard TTL, the noise margin is 1.6 volts. Other logic families, such emitter-coupled logic (ECL) and nonstandard TTL, utilize voltage ranges having a smaller noise margin.

Noise exists everywhere in an electrical environment; it can be generated within a digital system itself or it can originate from sources outside this system. Internal sources include switching noise, in the form of transmitted RF pulses and/or spikes imparted to the dc power supply lines, generated by the gates themselves as they switch from one digital logic state to another. External noise sources include electromagnetic radiation which induces a current flow in a conductor which is located in a circuit and hence acts as an antenna. Other sources include power supply and power line noise produced by other operating equipment, especially rotating machinery or equipment which uses electro-mechanical contacts (relays, circuit breakers and/or contactors) and draws arcs therebetween whenever the contacts open.

Oftentimes, if a noise pulse has a sufficiently large amplitude and is applied to an input of a gate, the gate often produces an erroneous output level. For example, if the input to a standard TTL inverter is at a low voltage level, such as 0.6 volts corresponding to a logical "0", and a noise pulse having a peak amplitude of 1.9 volts momentarily appears on the lead connected to this input, then the total voltage appearing at this input during the noise pulse will momentarily increase to 2.5 volts. Once, the total input voltage exceeds 2.4 volts, the inverter will interpret this voltage as a "1" and will momentarily change its output state from "1" to "0". Such a change is erroneous and could likely produce incorrect operation of the circuitry situated downstream of the inverter.

Various techniques exist in the art to minimize the impact of noise on digital logic. One technique involves using logic that employs a higher power supply potential in order to shift the magnitude of the entire voltage range which represents a "1" upward and thereby increase the noise margin. Unfortunately, this disadvantageously increases the power consumed by each gate. An alternate technique is to use a different digital technology, such as complementary metal oxide semiconductor (CMOS). CMOS technology possesses relatively narrow voltage ranges and therefore has an increased noise margin. While CMOS possesses an increased noise margin over TTL, CMOS is far slower than TTL at the same power supply voltage. Thus CMOS is unsuitable for use in implementing high-speed digital logic.

Thus, a need exists in the art for apparatus which increases the noise margin of a gate that operates at a relatively low power supply voltage and which minimally, if at all, decreases the speed at which that gate operates and does not necessitate increasing the magnitude of the power supply voltage.

SUMMARY OF THE INVENTION

Accordingly, an object of the present invention is to provide apparatus for inclusion in a gate which increases the input noise margin of the gate.

A particular object is to provide such apparatus which does not significantly decrease the speed at which the gate operates.

Another particular object is to provide such apparatus which eliminates the need to increase the magnitude of the power supply voltage applied to that gate.

These and other objects are achieved in accordance with the principles of the present invention by incorporating a circuit within a gate which increases the noise margin of that gate during an input transition. In particular, this circuit momentarily increases the current flowing through an input switching circuit located within the gate whenever any one of the inputs changes state, e.g. undergoes a transition from a "0" to a "1." By momentarily increasing the magnitude of this current during an input transition, a step change in voltage is reflected back to the input thereby momentarily increasing the noise margin of the gate during that transition.

Specifically, in accordance with a preferred embodiment described below, a current source, using a single transistor, sinks current from the input switching circuit. A separate circuit, comprising another transistor, senses whether the input signals to the gate change according to a pre-defined logical function. A feedback path is provided between this current source and this sensing circuit. During the time one of these inputs changes state, the feedback path operates to momentarily increase the magnitude of the current sunk from the input switching circuit by the current sink and thereby momentarily change the level of the voltage reflected back to the changing input. Once the input has reached an appropriate high or low voltage level, the feedback path no longer operates and the current and the reflected input voltage both return to normal values.

BRIEF DESCRIPTION OF THE DRAWING

The principles of the present invention may be clearly understood by considering the following detailed description in conjunction with the drawing, in which:

FIG. 1 is a schematic diagram of a gate, specifically an inverter, that incorporates the teachings of the present invention.

DETAILED DESCRIPTION

Those skilled in the art will shortly realize that the teachings of the present invention can be readily incorporated into many different digital gating circuits, e.g.

NAND gates, NOR gates and the like, to advantageously increase the input noise margin of these gates. For purposes of simplifying both the ensuing discussion and the drawing, the present invention is described in terms of a very simple digital circuit, an inverter, which converts ground-up digital logic levels to inverted ground-down levels.

Logic levels, such as in TTL, which utilize a range of relatively low value positive voltages to represent a "0" and a range of higher value positive voltages to represent a "1", are often referred to as "ground-up" levels. By contrast, logic levels which utilize a range of relatively low value negative voltages (ground or zero to −0.6 volts) to represent a "1" and a range of larger value negative voltages (e.g. −2.4 to −5 volts) to represent a "0" are often referred to as "ground-down" levels. With both ground-up and ground-down type logic levels, the more positive of the two voltage ranges in each type is always used to represent logical value "1."

FIG. 1 shows a schematic of a gate, inverter 1, which incorporates the teachings of the present invention. This inverter would be used, for example, as an interface between a digital system employing ground-up digital levels and a digital system employing ground-down digital levels.

As shown, a ground-up digital input signal A, is applied to input 3, and the inverted ground-down output signal, A not, appears at output 9. In order to cause output 9 to assume a high impedance state, a ground-up high voltage level, i.e. logical value "1", can be applied to High-Z Enable input 6 whenever the input signal is low (logical value "0").

Inverter 1 is comprised of four separate interconnected circuits: circuit 4 which is an input current switch and contains transistors 20 and 30; circuit 5 which increases the noise margin of the inverter and contains transistors 40 and 50, and feedback path 43; and circuit 7 which contains transistors 60 and 70 and provides level translation and buffering for an output buffer formed of transistors 80 and 90 in circuit 8. As shown, all the transistors are NPN type.

In particular, within circuit 4, input signal A is applied, via input 3 through diode 23 and pull-up resistor 21, to the base of transistor 20. The High-Z Enable signal, appearing at input 6, is directly applied to the base of transistor 30. The collectors of transistors 20 and 30 are tied together and connected to one end of resistor 31, which is connected at its other end to the positive supply voltage, +V. The emitters of transistors 20 and 30 are tied together and connected to one end of resistor 35. The other end of this resistor is connected to node 42 situated within circuit 5. Together transistors 20 and 30 function as an input current switch. As discussed below, this current switch operates according to a predefined logical function of the signals appearing at inputs 3 and 6 of the inverter.

Within circuit 5, node 42 is connected to one end of resistors 37 and 41, and to the base of transistor 50. The other end of resistor 37 is connected to the negative supply voltage, −V. The collector of transistor 50 is connected, via resistor 53, to ground and also to the base of transistor 40, via feedback path 43. The collector of transistor 40 is connected to resistor 41 and the emitter of this transistor is connected, through Schottky diode 45, to the negative supply voltage, −V. Transistor 40 provides a current sink for the input current switch located in circuit 4. The amount of current sunk by transistor 40 is controlled by the signal appearing on feedback path 43 and applied to the base of this transistor. Output from circuit 5 is taken from the emitter of transistor 50 and fed directly to the base of transistor 60, situated within circuit 7.

Within circuit 7, the emitter of transistor 60 is connected to negative supply voltage −V, and its collector is connected both to the base of transistor 70 and also, through resistor 63, to positive supply voltage +V. The collector of transistor 70 is grounded and its emitter is connected through resistor 75 to negative supply voltage −V and also, as input, to the base of transistors 80 and 90, both situated within circuit 8.

Transistors 80 and 90 are connected in parallel to provide increased drive capability. These transistors have both their collectors grounded and their emitters tied, via leads 93, to output 9 and, via diode 83, to negative supply voltage −V.

In accordance with the teachings of the invention, circuit 5, particularly transistors 40 and 50, and feedback path 43 therebetween, provides inverter 1 with an increased input noise margin. Now, to explain how this inverter operates and, in particular, the manner in which circuit 5 provides an increased input noise margin, we will first describe the static operation of the inverter, i.e. when the feedback path is inoperative. Once having done that, we will then proceed to discuss how the inverter operates during an input transition, i.e. when the feedback path is operative.

Static Operation

For purposes of this discussion assume that input signal A appearing at input 3 and the HIGH-Z Enable signal appearing at input 6 are both low, i.e. less than a diode drop above ground. In this case, both transistors 20 and 30 will be off, i.e. non-conductive. With the values of resistors 37 and 41 properly selected, the voltage at node 42 will be insufficient to turn transistor 50 on. Thus, transistor 50 will remain off. However, base current will flow, via resistor 53, through the base-emitter junction of transistor 40 and through Schottky diode 45 to the negative supply voltage, −V. Hence, the negative voltage appearing at the collector of transistor 50 will equal the value of the negative supply voltage, −V, less the drop of approximately 0.6 volts across Schottky diode 45 and the drop of approximately 0.7 volts across the base to emitter junction of transistor 40. Further, inasmuch as one end of resistor 37 and one end of Schottky diode 45 are connected to the same potential, there will be no voltage appearing across the collector and emitter of transistor 40. As a result, transistor 40 will be off and the feedback path provided via lead 43 will be inoperative. Hence, no current will flow through resistors 35, 37 and 41.

With transistor 50 being off, the voltage appearing at its emitter is the negative voltage supply voltage, −V, which, in turn, forces transistor 60 off. As such, transistor 70 is forced on because positive voltage +V is applied to its base, via resistor 63. Once transistor 70 is turned on, the voltage appearing at its emitter decreases negatively to approximately the ground potential—in actuality, the value $-V_{CEsat}$ which usually equals approximately −0.2 volts. When this emitter voltage is applied to the base of transistors 80 and 90, these transistors turn on and output 9 assumes a low-impedance state. Consequently, the ground-down voltage level at output 9, which varies between two negative voltages, becomes less negative, thereby equivalent to a "1" logical level. In this case, diode 83 is reverse-biased and non-conductive.

Now, whenever either signal A, appearing at input 3, or the HIGH-Z Enable signal, appearing at input 6, is high, i.e. logical value "1", the voltage at the base of either transistor 20 or 30 is high and hence the corresponding one of these two transistors conducts. As a result, the voltage at node 42, determined by the values of resistors 35, 37 and 41, is sufficiently positive to ensure that transistor 50 conducts. Hence, the voltage at the emitter of transistor 50, when applied to the base of transistor 40 via feedback path 43, is sufficiently negative to keep transistor 40 off, i.e. non-conductive. With transistor 50 conducting, the voltage appearing at its emitter, through appropriate selection of the value of resistor 53, has a sufficiently low negative value to turn on transistor 60, when applied to its base. With transistor 60 conducting, its collector voltage is highly negative, i.e. $-V-V_{CEsat}$. As a result, this voltage, when applied to the base of transistor 70, keeps transistor 70 off. Consequently, the emitter voltage of transistor 70 becomes approximately $-V$. As a result, this emitter voltage, when applied to the bases of transistors 80 and 90, keeps these transistors off. Hence, output 9 is in a high-impedance state and the ground-down voltage level at this output becomes more negative, thereby equivalent to a logical "0."

Operation during an Input Transition

With the foregoing in mind, we will now discuss the manner in which circuit 5 imparts an increased noise margin to inverter 1. As noted, the feedback path is operative during an input transition and as such increases the noise margin of the inverter.

For this discussion, assume that the HIGH-Z Enable input signal, appearing at input 6, is low and that input signal A, appearing at input 3, is changing from a high to a low level. During this transition, transistor 20 becomes less conductive, and the current flowing through resistor 35 decreases. By virtue of resistors 37 and 41, the voltage at node 42 increases negatively and, as such, transistor 50 also becomes increasingly less conductive. As a result, the voltage appearing at the collector of transistor 50 becomes less negative, i.e. it rises positively towards the ground potential. However, the voltage at node 42 is still positive with respect to the negative supply voltage, $-V$. As the collector voltage of transistor 50, appearing at the base of transistor 40 by virtue of feedback path 43, becomes less negative, this voltage causes transistor 40 to begin conducting. As soon as transistor 40 starts to conduct, it immediately sinks current flowing through resistors 35 and 41. This, in turn, causes the voltage at node 42 to increase even more negatively. As a result, the voltage at the base of transistor 50 decreases (increases negatively) even further. This decrease further increases the base voltage applied to transistor 40 thereby increasing its collector current and increasing the voltage at node 42 even more negatively. This process continues until transistor 50 has stopped conducting. At that point, the voltage at node 42 has increased negatively to the value $-V$; transistor 40 has ceased conducting and the feedback path is no longer operative. By virtue of feedback path 43 between transistors 40 and 50, as soon as transistor 50 becomes less conductive during a high to low input transition, transistor 40 will be forced momentarily on. This will quickly force transistor 50 off and impart a downward step change in the emitter voltage of transistor 50, i.e. the voltage applied to the base of transistor 60. A similar step change, i.e. a downward level shift, occurs at node 42. By suitably selecting the values of resistors 35, 37 and 41, the step change occurring at node 42 can be set to approximately 500 milli-volts and the step change occurring at the base of transistor 60 can be set on the order of 200 milli-volts. This 500 milli-volts step change occurring at node 42 is reflected back through transistor 20 to input 3 of inverter 1 and, as such, advantageously increases the input noise margin of the inverter by approximately 500 milli-volts. This increase in noise margin is advantageously achieved without increasing the magnitude of any power supply voltage applied to the gate. In addition, inclusion of circuit 5 within inverter 1 has only an insignificant affect on the maximum speed at which inverter 1 can operate.

The feedback path is also similarly operative during a low to high transition of signal A. Specifically, as soon as input A has decreased to a sufficiently low positive value, transistor 20 begins to conduct. Prior to that point, transistors 20, 30, 40, 50 and 60 were all non-conductive. Although transistor 50 does not conduct, the base-emitter junction of transistor 40 is forward biased and base current is flowing through resistor 53 and through the base-emitter junction of transistor 40. Once transistor 20 begins to conduct, current begins to flow through resistor 35 and the voltage at node 42 rises positively. As a result, the base voltage for transistor 50 rises. This causes transistor 50 to begin conducting. Moreover, as soon as the voltage at node 42 increases positively from $-V$, collector current begins to flow through resistor 41 and transistor 40. This current flow through transistor 40 further increases the positive voltage occurring at node 42 which, in turn, causes transistor 50 to become more conductive. As such, the collector voltage at transistor 50 increases negatively and, by virtue of feedback path 43, eventually forces transistor 40 off. As a result of feedback path 43 between transistors 40 and 50, transistor 40 is momentarily turned on during a low to high transition and an upward step change of approximately 200 milli-volts is thereby imparted to the emitter voltage at transistor 50. In addition, a positive step change on the order of 500 milli-volts occurs in the voltage at node 42. This 500 milli-volt step change is reflected back, through conducting transistor 20, to input 3 of the inverter, thereby again advantageously increasing the noise margin of the inverter. By selecting suitable values for resistors 35 and 37, transistors 40 and 50 will not latch up during a low to high transition.

By now, those skilled in the art readily realize that the teachings of the present invention can be used to increase the input noise margin in a wide variety of digital gates. In particular, the invention is not limited to a simple inverter, but can be advantageously be incorporated into any multiple input gate. Specifically, circuit 4 need not be limited to only a simple two input current switch as shown in FIG.1 but instead can have a number of separate inputs. Each input would have an associated input transistor, such as transistor 20, and pull-up circuitry, such as resistor 21 and input diode 23. As with the inverter discussed above, the state of the input current switch would be governed by a pre-defined logical (Boolean) function of the input digital signals. While the current switch in the inverter operated according to a very simple logical function, an input current switch for use in a multiple input gate could operate according to a fairly simple expression, such as AND, OR and the like, or even according to a more complex Boolean expression. Moreover, the output stage, circuits 7 and 8, can be readily re-designed in a well-known fashion to provide any desired output voltage levels, and not just ground-down levels as discussed above.

Although a single embodiment of the invention has been shown and discussed above, this embodiment merely illustrates the teachings of the present invention.

We claim:

1. Apparatus for a gate having an increased noise margin, said apparatus comprising:
    switching means, connected to a circuit node and having a digital input responsive to a digital input signal, for supplying current to said circuit node whenever said digital input signal assumes an appropriate logical value;
    a current sink, connected to said circuit node and operative in response to a feedback signal, for sinking current from said circuit node and supplied through said switching means; and
    means, connected to said circuit node and being responsive to a voltage appearing at said circuit node, for generating said feedback signal, wherein whenever the value of the voltage appearing at said circuit node reaches an appropriate level said feedback signal momentarily activates said current sink to impart a momentary step change to the voltage appearing at said circuit node such that a portion of said step change is applied through said switching means to said digital input in order to momentarily increase the noise margin of the gate.

2. The apparatus in claim 1 wherein said switching means comprises means, connected to said circuit node, to a first fixed voltage source and to said digital input signal, for causing current to flow from said first fixed voltage source to said circuit node in response to said digital input signal; and wherein said current sink comprises means, connected to said circuit node, to a second fixed voltage source and to said feedback signal, for causing current to flow from said circuit node to said second fixed voltage source in response to said feedback signal.

3. The apparatus in claim 2 wherein said current sink comprises a first transistor having an emitter, a base and a collector, wherein the collector of the first transistor is connected through a first resisitor to said circuit node, the emitter of the first transistor is connected through a diode to said second fixed voltage source and the base of the first transistor is connected to said feedback signal.

4. The apparatus in claim 3 wherein said generating means comprises a second transistor having an emitter, a base and a collector, wherein the collector of said second transistor is connected through a second resistor to a third fixed voltage source, said base of said second transistor is connected to said circuit node and said emitter is connected through a third resistor to said second fixed voltage source, and wherein the collector of said second transistor is connected to the base of said first transistor such that the voltage appearing at the collector of said second transistor is said feedback signal.

5. The apparatus in claim 4 further comprising means, connected to said generating means and responsive to an output signal produced by said generating means, for producing a digital output signal.

6. The apparatus in claim 5 wherein said producing means comprises means, connected to the emitter of said second transistor, for translating and buffering a voltage appearing at the emitter of the second transistor into appropriate output voltage levels form said digital output signal.

7. The apparatus in claim 6 wherein said producing means further comprises means, responsive to the emitter voltage of said second transistor and to said first, second and third fixed voltage sources, for causing said digital output signal to assume a pre-selected one of two pre-determined ground-down digital logic levels.

8. The apparatus in claim 7 wherein said first fixed voltage source generates a pre-determined positive voltage, said second fixed voltage source generates a pre-determined negative voltage and said third fixed voltage source is ground potential.

9. Apparatus for a gate having an increased noise margin, said apparatus comprising:
    switching means, connected to a first fixed voltage source and to a circuit node and having a digital input responsive to a digital input signal, for causing current to flow from said first fixed voltage source to said circuit node whenever said digital input signal assumes an appropriate logical value;
    a current sink, connected to said circuit node and to a second fixed voltage source and operative in response to a feedback signal, for causing current to flow from said circuit node to said second fixed voltage source in response to said feedback signal; and
    means, connected to said circuit node and being responsive to a voltage appearing at said circuit node, for generating said feedback signal, wherein whenever the value of the voltage appearing at said circuit node reaches an appropriate level said feedback signal momentarily activates said current sink to impart a momentary step change to the voltage appearing at said circuit node such that a portion of said step change is applied through said switching means to said digital input in order to momentarily increase the noise margin of the gate.

10. The apparatus in claim 9 wherein said current sink comprises a first transistor having an emitter, a base and a collector, wherein the collector of the first transistor is connected through a first resistor to said circuit node, the emitter of the first transistor is connected through a diode to said second fixed voltage source and the base of the first transistor is connected to said feedback signal.

11. The apparatus in claim 10 wherein said generating means comprises a second transistor having an emitter, a base and a collector, wherein the collector of said second transistor is connected through a second resistor to a third fixed voltage source, said base of said second transistor is connected to said circuit node and said emitter is connected through a third resistor to said second fixed voltage source, and wherein the collector of said second transistor is connected to the base of said first transistor such that the voltage appearing at the collector of said second transistor is said feedback signal.

12. The apparatus in claim 11 further comprising means, connected to said generating means and responsive to an output signal produced by said generating means, for producing a digital output signal.

13. The apparatus in claim 12 wherein said producing means comprises means, connected to the emitter of said second transistor, for translating and buffering a voltage appearing at the emitter of the second transistor into appropriate output voltage levels form said digital output signal.

14. Apparatus for a gate having an increased noise margin, said apparatus comprising:

switching means, connected to a first fixed voltage source and to a circuit node and having a digital input responsive to a digital input signal, for causing current to flow from said first fixed voltage source to said circuit node whenever said digital input signal assumes an appropriate logical value;

a current sink, connected to said circuit node and to a second fixed voltage source and operative in response to a feedback signal, for causing current to flow from said current node to said second fixed voltage source in response to said feedback signal; said current sink having a first transistor with an emitter, a base and a collector, wherein the collector of the first transistor is connected through a first resistor to said circuit node, the emitter of the first transistor is connected through a diode to said second fixed voltage source and the base of the first transistor is connected to said feedback signal; and means, connected to said circuit node and being responsive to a voltage appearing at said circuit node, for generating said feedback signal, wherein whenever the value of the voltage appearing at said circuit node reaches an appropriate level said feedback signal momentarily activates said current sink to impart a momentary step change to the voltage appearing at said circuit node such that a portion of said step change is applied through said switching means to said digital input in order to momentarily increase the noise margin of the gate; said generating means having a second transistor with an emitter, a base and a collector, wherein the collector of said second transistor is connected through a second resistor to a third fixed voltage source, said base of said second transistor is connected to said circuit node and said emitter is connected through a third resistor to said second fixed voltage source, and wherein the collector of said second transistor is connected to the base of said first transistor such that the voltage appearing at the collector of said second transistor is said feedback signal.

15. The apparatus in claim 14 further comprising means, connected to said generating means and responsive to an output signal produced by said generating means for producing a digital output signal.

16. The apparatus in claim 15 wherein said producing means comprises means, connected to the emitter of said second transistor, for translating and buffering a voltage appearing at the emitter of the second transistor into appropriate output voltage levels form said digital output signal.

* * * * *